(12) United States Patent
Ding et al.

(10) Patent No.: US 11,335,753 B2
(45) Date of Patent: May 17, 2022

(54) DISPLAY PANEL AND DISPLAY DEVICE HAVING DISCONTINUOUS ORGANIC LIGHT-EMITTING LAYER

(71) Applicant: WUHAN CHINA STAR OPTOELECTRONICS SEMICONDUCTOR DISPLAY TECHNOLOGY CO., LTD., Wuhan (CN)

(72) Inventors: Ding Ding, Wuhan (CN); Liang Fang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 257 days.

(21) Appl. No.: 16/623,472

(22) PCT Filed: Sep. 23, 2019

(86) PCT No.: PCT/CN2019/107209
§ 371 (c)(1),
(2) Date: Dec. 17, 2019

(87) PCT Pub. No.: WO2020/211288
PCT Pub. Date: Oct. 22, 2020

(65) Prior Publication Data
US 2021/0359024 A1    Nov. 18, 2021

(30) Foreign Application Priority Data
Apr. 17, 2019    (CN) .......................... 201910309661.5

(51) Int. Cl.
*H01L 27/32*    (2006.01)
*H01L 51/52*    (2006.01)
*G02F 1/1335*   (2006.01)

(52) U.S. Cl.
CPC ........ *H01L 27/326* (2013.01); *H01L 27/3234* (2013.01); *H01L 51/5253* (2013.01);
(Continued)

(58) Field of Classification Search
CPC .............. H01L 27/326; H01L 27/3234; H01L 51/5253; H01L 51/5281; H01L 51/5293;
(Continued)

(56) References Cited

U.S. PATENT DOCUMENTS 9,577,013 B2 * 2/2017 Park ..................... H01L 27/3232
10,497,900 B2 * 12/2019 Choi .................... H01L 27/3258
(Continued)

FOREIGN PATENT DOCUMENTS

| CN | 109346505 A | 2/2019 |
| CN | 109461839 A | 3/2019 |

OTHER PUBLICATIONS

Office Action issued in corresponding Chinese Application No. 201910309661.5 dated Dec. 17, 2019, and English translation thereof (11 pages).

*Primary Examiner* — Ida M Soward
(74) *Attorney, Agent, or Firm* — Osha Bergman Watanabe & Burton LLP

(57) ABSTRACT

A display panel and a display device are disclosed. The display panel includes an array substrate, an organic light-emitting layer, a thin-film encapsulation layer, and a polarizing film. The array substrate includes at least two inorganic layers disposed on an underlay substrate. In a transparent display region, at least two inorganic layers include at least one first hole. The organic light-emitting layer has faults in (Continued)

a position of the first hole. A transparent sealant is used to cover edges of the faults of the organic light-emitting layer.

15 Claims, 7 Drawing Sheets

(52) U.S. Cl.
CPC .... *H01L 51/5281* (2013.01); *G02F 1/133528* (2013.01); *H01L 51/5246* (2013.01); *H01L 51/5293* (2013.01); *H01L 2251/301* (2013.01)

(58) Field of Classification Search
CPC ........... H01L 51/5246; H01L 2251/301; H01L 27/1218; H01L 27/3244; H01L 29/78606; G02F 1/133528; G09F 9/33
See application file for complete search history.

(56) References Cited

U.S. PATENT DOCUMENTS

| | | | | |
|---|---|---|---|---|
| 10,658,628 | B2* | 5/2020 | Lee | H01L 51/5253 |
| 10,672,841 | B2* | 6/2020 | Kim | H01L 51/56 |
| 10,803,285 | B2* | 10/2020 | Zhao | H01L 51/5284 |
| 11,043,657 | B1* | 6/2021 | Chen | H01L 51/56 |
| 2009/0321764 | A1 | 12/2009 | Lee et al. | |
| 2015/0333113 | A1* | 11/2015 | Koyama | H01L 27/3248 257/72 |
| 2018/0108685 | A1* | 4/2018 | Kim | H01L 27/1262 |
| 2019/0273125 | A1* | 9/2019 | Takechi | H01L 27/3265 |
| 2021/0159447 | A1* | 5/2021 | Wang | H01L 27/3244 |
| 2021/0234125 | A1* | 7/2021 | Sung | H01L 51/52 |

* cited by examiner

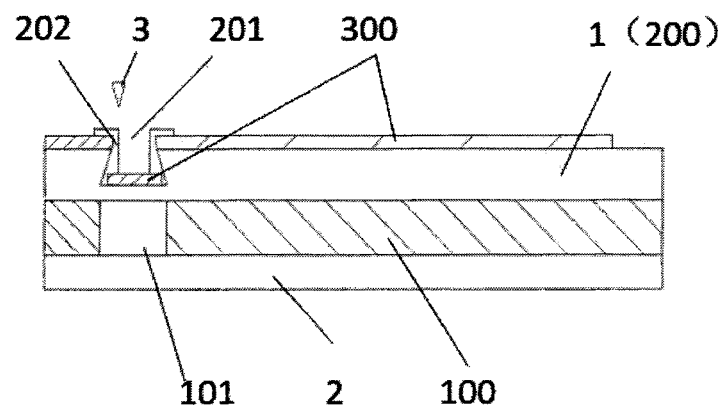
FIG. 5e(1)
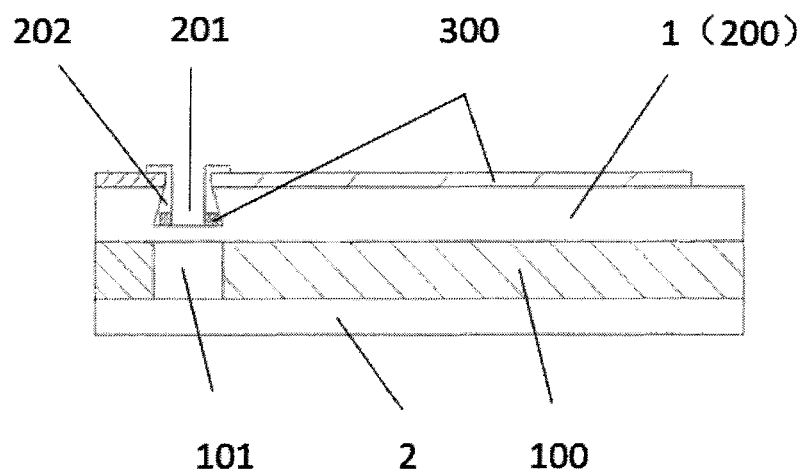
FIG. 5e(2)

DISPLAY PANEL AND DISPLAY DEVICE HAVING DISCONTINUOUS ORGANIC LIGHT-EMITTING LAYER

BACKGROUND OF DISCLOSURE

1. Field of Disclosure

The present disclosure relates to the technical field of display panel, and more particularly, to a display panel and a display device.

2. Description of Related Art

One important performance of organic electroluminescence display devices is to take pictures. Currently, in mainstream technologies, a device of taking pictures is designed in external non-display region of a display device. Such design has a major disadvantage that the integration of display device is lower, reducing an effective display area significantly.

An opening design can increase the effective display area of the display device, that is, designing a camera assembly in a display region. As shown in FIG. 1, the display device is designed to have an opening corresponding to a region of camera assembly. Without being limited to FIG. 1, the opening can exist in different positions.

Referring to FIG. 2, which is a cross-sectional view of a display panel in conventional technologies. An organic light-emitting layer 300 of the display panel is evaporated in full. In the organic light-emitting layer 300, a film layer such as cathode layer has lower light permeability. In order to increase the effect of taking pictures, an upper portion of the organic light-emitting layer 300 must be eliminated through a laser cutting method. However, sides of the organic light-emitting layer 300 cut by a laser are exposed to an external environment and thus are prone to be invaded by water and oxygen. In addition, massive dust generated from the cutting of laser is prone to pollute the neighborhood, affecting the reliabilities of display devices.

SUMMARY

The object of the present disclosure is to provide a display panel, a display device, and a manufacturing method. The display panel includes an array substrate, an organic light-emitting layer, a thin-film encapsulation layer, and a polarizing film. The array substrate includes at least two inorganic layers disposed on an underlay substrate. In the transparent display region, at least two inorganic layers of the array substrate include at least one first hole extending from a surface of an inorganic layer in contact with the organic light-emitting layer toward the underlay substrate along a vertical direction, and an aperture size of the first hole in the surface of the inorganic layer in contact with the organic light-emitting layer is less than that of the first hole extending toward the underlay substrate. The organic light-emitting layer has a fault in a position of the first hole. Edges of faults of the organic light-emitting layer are covered with a transparent sealant in order to protect the edges of the organic light-emitting layer when a laser is used, preventing vapors from invading devices through the edges of the faults of the organic light-emitting layer and thus improving the reliability of the display device.

In order to realize the above object, the present disclosure adopts the following technical solution:

The present disclosure provides a display panel having a transparent display region and an ordinary display region surrounding the transparent display region, the display panel including:

an array substrate including at least two inorganic layers disposed on an underlay substrate;

an organic light-emitting layer disposed on the array substrate;

a thin-film encapsulation layer disposed on the organic light-emitting layer and covering the organic light-emitting layer, at least one first hole, and a transparent sealant; and a polarizing film stuck on the thin-film encapsulation layer;

wherein in the transparent display region, at least two inorganic layers of the array substrate include at least one first hole extending from a surface of an inorganic layer in contact with the organic light-emitting layer toward the underlay substrate along a vertical direction, and an aperture size of at least one first hole in the surface of the inorganic layer in contact with the organic light-emitting layer is less than that of at least one first hole extending toward the underlay substrate; wherein the organic light-emitting layer breaks in a position of at least one first hole; wherein the transparent sealant is disposed around at least one first hole to cover edges of a fault of the organic light-emitting layer; and wherein textures of at least two inorganic layers of the array substrate are gradually loose in a direction from the organic light-emitting layer to the underlay substrate.

Further, the polarizing film has a through hole corresponding to at least one first hole.

Further, the thin-film encapsulation layer has a second hole corresponding to at least one first hole, and wherein the second hole communicates with the through hole.

Further, a height of the transparent sealant perpendicular to the underlay substrate is greater than or equal to the sum of a depth of at least one first hole and a thickness of the organic light-emitting layer.

Further, in the transparent display region, the underlay substrate has a third hole corresponding to at least one first hole, a transparent flexible filling material is disposed in the third hole, and the transparent flexible filling material is colorless polyimide (CPI).

Further, the third hole passes through the underlay substrate or a part of the underlay substrate vertically.

Further, the transparent display region has a shape of a circle, a square, an oval, or a rhombus.

A display panel having a transparent display region and an ordinary display region surrounding the transparent display region, the display panel including:

an array substrate including at least two inorganic layers disposed on an underlay substrate; and an organic light-emitting layer disposed on the array substrate;

wherein in the transparent display region, at least two inorganic layers of the array substrate include at least one first hole extending from a surface of an inorganic layer in contact with the organic light-emitting layer toward the underlay substrate along a vertical direction, and an aperture size of at least one first hole in the surface of the inorganic layer in contact with the organic light-emitting layer is less than that of at least one first hole extending toward the underlay substrate; and wherein the organic light-emitting layer breaks in a position of at least one first hole.

Further, a transparent sealant is disposed around at least one first hole to cover edges of a fault of the organic light-emitting layer.

Further, the display panel further includes a thin-film encapsulation layer disposed on the organic light-emitting layer and covering the organic light-emitting layer, at least one first hole, and the transparent sealant; and a polarizing film stuck on the thin-film encapsulation layer.

Further, the polarizing film has a through hole corresponding to at least one first hole.

Further, the thin-film encapsulation layer has a second hole corresponding to at least one first hole, and wherein the second hole communicates with the through hole.

Further, textures of at least two inorganic layers of the array substrate are gradually loose in a direction from the organic light-emitting layer to the underlay substrate.

Further, a height of the transparent sealant perpendicular to the underlay substrate is greater than or equal to the sum of a depth of at least one first hole and a thickness of the organic light-emitting layer.

Further, in the transparent display region, the underlay substrate has a third hole corresponding to at least one first hole, a transparent flexible filling material is disposed in the third hole, and the transparent flexible filling material is colorless polyimide (CPI).

Further, the third hole passes through the underlay substrate or a part of the underlay substrate vertically.

Further, the transparent display region has a shape of a circle, a square, an oval, or a rhombus.

The present disclosure further provides a display device, including the above display panel and a camera installed below the transparent display region, wherein a shape and a size of the transparent display region match those of the camera.

The advantage of the present disclosure is that an opening design can increase a screen ratio of the display device. Inorganic layers of a thin-film transistor layer are of a multilayered structure, and there exist differences in textures between different layers, that is, textures of films are loose respectively from top to bottom. Through being etched, the first hole can be of a structure with a narrow upper portion and a wide lower portion. While evaporating the organic light-emitting layer, faults occur in the transparent display region. The transparent sealant is disposed around the first hole to cover edges of a fault of the organic light-emitting layer, reducing the impact of a laser cutting the organic light-emitting layer in an ordinary display region and thus improving the reliability of the display device.

BRIEF DESCRIPTION OF DRAWINGS

In order to more clearly illustrate technical solutions in the embodiments of the present disclosure, the drawings required for describing the embodiments will be briefly introduced below. It is obvious that the following drawings are merely some embodiments of the present disclosure, and a person having ordinary skill in this field can obtain other drawings according to these drawings under the premise of not paying creative works.

FIGS. 5a-5g are schematic structural diagrams of a display panel in executed steps of a method for manufacturing a display panel according to a preferred embodiment of the present disclosure.

DETAILED DESCRIPTION OF EMBODIMENTS

Figure 1:
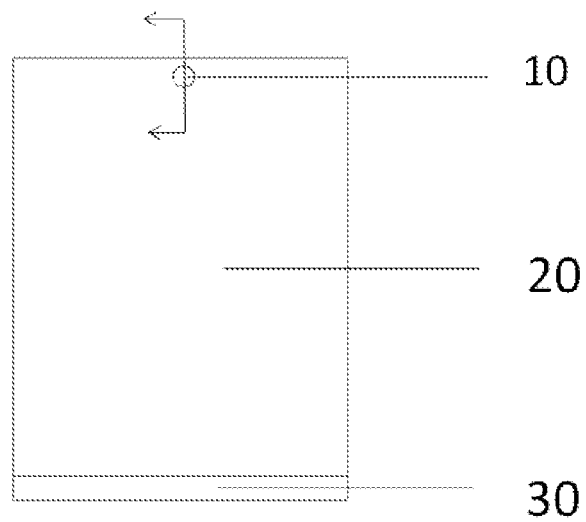
FIG. 1 is a top view of a display panel structure in conventional technologies and in an embodiment of the present disclosure.
Figure 2:
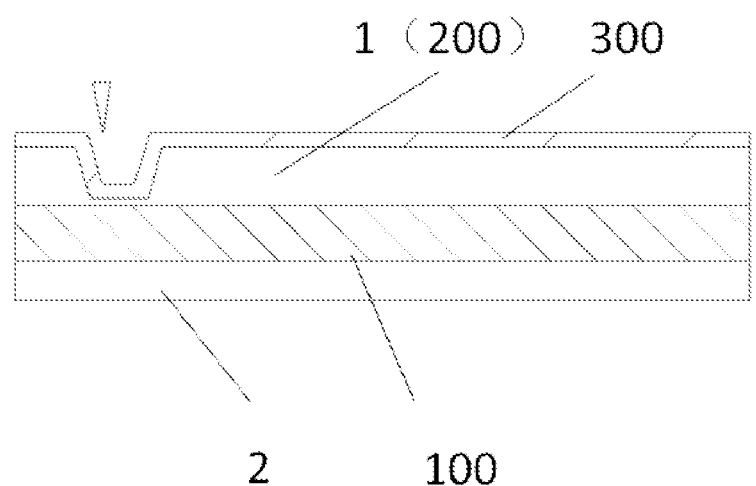
FIG. 2 is a cross-sectional view of a display panel in conventional technologies.

The technical solutions in the embodiments of the present disclosure will be described clearly and completely in conjunction with the accompanying drawings in the embodiments of the present disclosure. Apparently, the described embodiments are merely a part of the embodiments of the present disclosure instead of all of the embodiments. All of the other embodiments obtained by those skilled in the related art without creative efforts, based on the embodiments in the present disclosure, belong to the protection scope of the present disclosure.

Terms "first", "second", "third" and the like (if existing) in the specification, the claims, and the accompanying drawings are used to distinguish similar objects instead of describing a specific sequence or a precedence order. It should be understood that the described objects can be exchanged in any suitable situations. In addition, terms "include", "have" and any variations thereof intend to cover nonexclusive inclusions.

In this patent document, the accompanying drawings discussed below and the various embodiments used to describe the principles of the present disclosure are by way of illustration only and should not be construed to limit the scope of the present disclosure. Those skilled in the art will understand that the principles of the present disclosure can be implemented in any suitably arranged system. The exemplary embodiments will be described in detail and examples of these embodiments are illustrated in the accompanying drawings. In addition, a terminal according to exemplary embodiments will be described in detail with reference to the accompanying drawings. Like reference numerals in the accompanying drawings denote like elements.

The terms used in the present specification are merely used to describe particular embodiments, and are not intended to reveal the concepts of the present disclosure. An expression used in the singular form encompasses the expression in the plural form, unless it has a clearly different meaning in the context. In the present specification, it is to be understood that the terms such as "including," "having," and "comprising" are intended to indicate the existence of the features, numbers, steps, actions, or combinations thereof disclosed m the specification, and are not intended to preclude the possibility that one or more other features, numbers, steps, actions, or combinations thereof can exist or can be added. Like reference numerals in the accompanying drawings denote like parts.

Referring to FIG. 1, an embodiment of the present disclosure provides a display panel having a transparent display region 10, an ordinary display region 20 surrounding the transparent display region 10, and an outside region 30 at the bottom of the ordinary display region 20. In some embodiments, the outside region 30 can also be disposed at other locations surrounding a display region of a display panel with an ordinary border or a narrow border. Also, in the field of borderless full-display screens, the outside region 30 is not disposed in the display panel.

Figure 3:
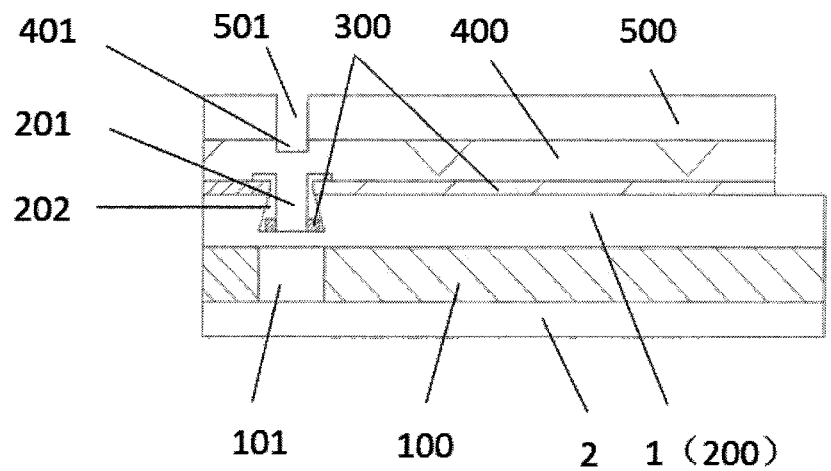
FIG. 3 is a cross-sectional view of a display panel according to an embodiment of the present disclosure.

Referring to FIG. 3, which is a cross-sectional view of a display panel arrowed in FIG. 1 according to an embodiment of the present disclosure. The present disclosure provides a display panel, including an array substrate 1 including at least two inorganic layers 200 disposed on an underlay substrate 100; an organic light-emitting layer 300 disposed on the array substrate 1; a thin-film encapsulation layer 400 disposed on the organic light-emitting layer 300 and covering the organic light-emitting layer 300; and a polarizing film 500 stuck on the thin-film encapsulation layer 400. In the embodiment of the present disclosure, for an organic light-emitting diode (OLED) display panel, the array substrate 1 further includes at least one thin-film transistor device, an anode layer, and a pixel defining layer. The thin-film transistor device includes an active layer, at least one source electrode, at least one drain electrode, a gate insulating layer, and at least one gate electrode.

Continuing to refer to FIG. 3, in the transparent display region 10, at least two inorganic layers 200 of the array substrate 1 include at least one first hole 201 extending from a surface of an inorganic layer in contact with the organic light-emitting layer 300 toward the underlay substrate 100 along a vertical direction, and an aperture size of the first hole 201 in the surface of the inorganic layer in contact with the organic light-emitting layer 300 is less than that of the first hole 201 extending toward the underlay substrate 100. The organic light-emitting layer 300 breaks in a position of the first hole 201.

Continuing to refer to FIG. 3, in the present disclosure, at least two inorganic layers 200 include, but are not limited to, a protective layer (PV), an interlayer dielectric layer (ILD), a gate insulating layer (GI), a buffer layer, a barrier layer, and at least two layers or multilayered structure of inorganic layers which overlap sequentially.

Continuing to refer to FIG. 3, in the embodiment of the present disclosure, at least two inorganic layers 200 are of a multilayered structure, and there exist differences in textures between different layers. Textures of at least two inorganic layers 200 are gradually loose in a direction from the organic light-emitting layer 300 to the underlay substrate 100. Such design is due to the correlation between texture intensity of layers and etching velocity. Textures of films are more intensive, but on the contrary the etching velocity is slower. Through etching at least two inorganic layers 200 simultaneously, the first hole 201 can be of a structure with a narrow upper portion and a wide lower portion. That is, the first hole 201 has a trapezoid shape, or a part of the first hole 201 in contact with the organic light-emitting layer 300 has an obtuse-angled shape.

The present disclosure provides four embodiments to specifically illustrate structures of texture difference of at least two inorganic layers 200.

Figure 4A:
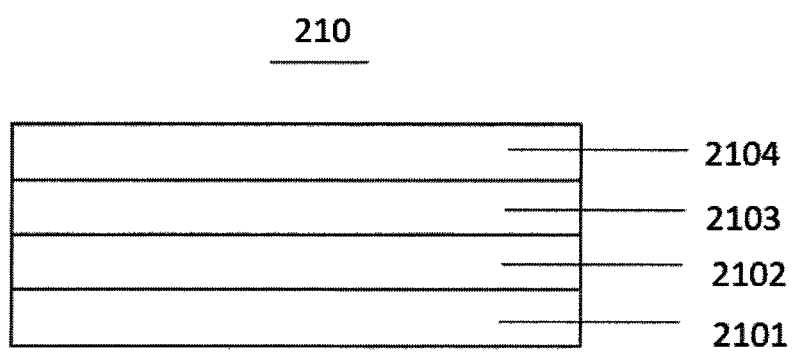
FIGS. 4a-4d are schematic structural diagrams of at least two inorganic layers of the display panel of the present disclosure.

Referring to FIG. 4a, in a first embodiment of the present disclosure, at least two inorganic layers 200 include a first structure of texture difference 210 having differential materials. Specifically, the first structure of texture difference 210 includes a first dielectric inorganic layer 2101, a second dielectric inorganic layer 2102, a third dielectric inorganic layer 2103, and a fourth dielectric inorganic layer 2104 which overlap sequentially. The fourth dielectric inorganic layer 2104 is in contact with the organic light-emitting layer 300. Textures of films are gradually loose in a direction from the fourth dielectric inorganic layer 2104 to the first dielectric inorganic layer 2101.

Figure 4B:
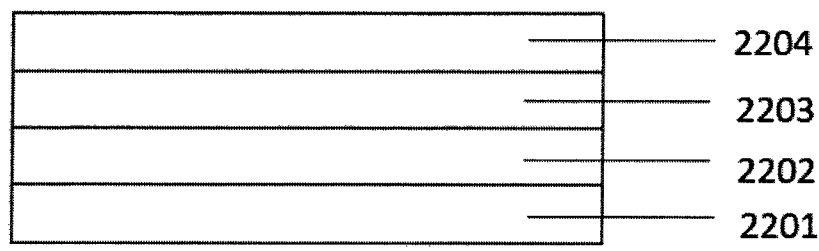

Referring to FIG. 4b, in a second embodiment of the present disclosure, at least two inorganic layers 200 include a second structure of texture difference 220. Specifically, the second structure of texture difference 220 includes a first dielectric layer 2201, a second dielectric layer 2202, a first passivation layer 2203, and a second passivation layer 2204 which overlap sequentially. The second passivation layer 2204 is in contact with the organic light-emitting layer 300. Textures of films are gradually loose in a direction from the second passivation layer 2204 to the first dielectric layer 2201.

Figure 4C:
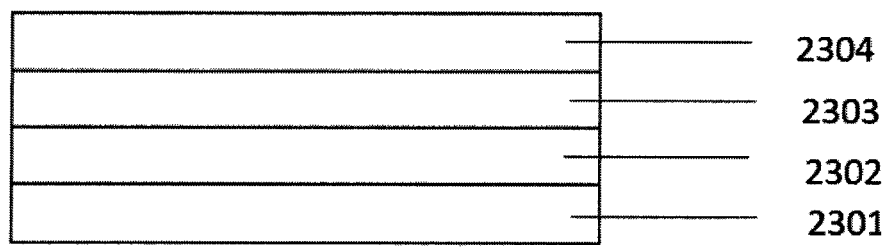

Referring to FIG. 4c, in a third embodiment of the present disclosure, at least two inorganic layers 200 include a third structure of texture difference 230. Specifically, the third structure of texture difference 230 includes a gate insulating layer 2301, a first dielectric inorganic layer 2302, a second dielectric inorganic layer 2303, and a passivation layer 2304 which overlap sequentially. The passivation layer 2304 is in contact with the organic light-emitting layer 300. Textures of films are gradually loose in a direction from the passivation layer 2304 to the gate insulating layer 2301.

Figure 4D:
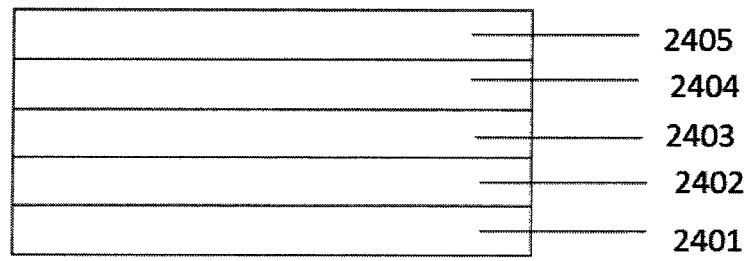

Referring to FIG. 4d, in a fourth embodiment of the present disclosure, at least two inorganic layers 200 include a fourth structure of texture difference 240. Specifically, the fourth structure of texture difference 240 includes a first gate insulating layer 2401, a second gate insulating layer 2402, a third dielectric layer 2403, a fourth dielectric layer 2404, and a passivation inorganic layer 2405. The passivation inorganic layer 2405 is in contact with the organic light-emitting layer 300. Textures of films are gradually loose in a direction from the passivation inorganic layer 2405 to the first gate insulating layer 2401.

For at least two inorganic layers 200 in the first embodiment through the fourth embodiment, forming the first hole 201 in at least two inorganic layers 200 using a dry etch process or a wet etch process so that an aperture size of the first hole 201 in the surface of the inorganic layer in contact with the organic light-emitting layer 300 is less than that of the first hole 201 extending toward the underlay substrate 100. The first hole 201 is of a trapezoid structure with a narrow upper portion and a wide lower portion. The orthogonal projection of the first hole 201 over the underlay substrate 100 lies within the orthogonal projection of the transparent display region 10 over the underlay substrate 100.

In other embodiments, a number of layers of at least two inorganic layers 200 can be more than four or five layers of the first embodiment through the fourth embodiment. At least two inorganic layers 200 can be one of a buffer layer, an interlayer dielectric layer, a passivation layer, a planarization layer, a gate insulating layer, or a combination thereof.

Continuing to refer to FIG. 3, through a full-evaporating process, the organic light-emitting layer 300 includes a hole transport layer, a light-emitting layer, an electron transport layer, and a cathode layer which overlap sequentially. The cathode layer has lower light permeability. Because the first hole 201 in the transparent display region 10 is of a structure with a narrow upper portion and a wide lower portion, or because a part of the first hole 201 near the organic light-emitting layer 300 has an obtuse-angled shape, the organic light-emitting layer 300 breaks under a stress action. The organic light-emitting layer 300 has faults on edges of the first hole 201, the location corresponding to the organic light-emitting layer 300 in the transparent display region 10 formed at the bottom of the first hole 201.

In the embodiment of the present disclosure, a transparent sealant 202 is disposed between the edges of the first hole 201 and edges of the faults of the organic light-emitting layer 300. The transparent sealant 202 is disposed around the first hole 201. A height of the transparent sealant 202 perpendicular to the underlay substrate 100 is greater than or equal to the sum of a depth of the first hole 201 and a thickness of the organic light-emitting layer 300, guaranteeing that the transparent sealant 202 can cover the edges of the faults of the organic light-emitting layer 300. The transparent sealant 202 is made of polymer materials. After the organic light-emitting layer 300 located at the bottom of the first hole 201 is cut and eliminated by a laser machine 3, the edges of the faults of the organic light-emitting layer 300 are still covered with the transparent sealant 202, so that the transparent sealant 202 can reduce the pollution on the organic light-emitting layer 300, and vapors are prevented from invading devices through the edges of the faults of the organic light-emitting layer 300. Thus, the reliabilities of display devices are improved.

Continuing to refer to FIG. 3, the underlay substrate 100 is deposited on a glass substrate 2. In the transparent display region 10, the underlay substrate 100 has a third hole 101 corresponding to the first hole 201. The third hole 101 passes through the underlay substrate 100 or a part of the underlay substrate 100 vertically. The orthogonal projection of the third hole 101 over the underlay substrate 100 lies within the orthogonal projection of the transparent display region 10 over the underlay substrate 100.

The underlay substrate 100 is flexible and is made of polyimide (PI). The underlay substrate 100 can be a single or multilayered PI layer. The underlay substrate 100 can also be made of polyethylene terephthalate (PET). In the present embodiment, the underlay substrate 100 is made of PI. However, because ordinary PI materials are yellow, deficiencies such as a shortage of light efficiency are caused. In the embodiment of the present disclosure, forming the third hole 101 in the underlay substrate 100 corresponding to the transparent display region 10 using a laser cutting process, and disposing a transparent flexible filling material in the third hole 101 so that the transparency of the organic light-emitting layer 300 is increased.

In the present embodiment, the transparent flexible filling material is colorless polyimide (CPI). The CPI has advantages such as being flexible, plastic foldable, colorless, transparent, and so on. The CPI can meet the need for the transparency of the transparent display region 10.

Continuing to refer to FIG. 3, the polarizing film 500 has a through hole 501 corresponding to the first hole 201. The through hole 501 passes through the polarizing film 500 using an etching process.

Continuing to refer to FIG. 3, the thin-film encapsulation layer 400 covers the organic light-emitting layer 300, the first hole 201, and the transparent sealant 202. The thin-film encapsulation layer 400 can prevent external vapors from affecting the reliability of performance of the organic light-emitting layer 300 in the transparent display region 10. The thin-film encapsulation layer 400 has a second hole 401 corresponding to the first hole 201. The second hole 401 communicates with the through hole 501. In the present embodiment, the second hole 401 is merely partly formed in the top of the thin-film encapsulation layer 400 using an etching process.

In a specific embodiment, the thin-film encapsulation layer 400 can be of a three-layer or multilayered structure. The three-layer structure includes a first thin-film encapsulation inorganic layer, a second thin-film encapsulation organic layer, and a third thin-film encapsulation inorganic layer. An encapsulation inorganic layer in the thin-film encapsulation layer 400 can be made of silicon nitride, silicon oxide, and aluminium oxide. An encapsulation organic layer in the thin-film encapsulation layer 400 can be made of acrylic materials and epoxy resin.

Referring to FIGS. 1 and 3, in conventional technologies and the embodiment of the present disclosure, forming the transparent display region 10 by disposing the first hole 201, the third hole 101, the second hole 401, and the through hole 501 in the ordinary display region 20. The orthogonal projection of the first hole 201, the third hole 101, the second hole 401, and the through hole 501 over the underlay substrate 100 lies within the transparent display region 10. A cross-sectional shape of the transparent display region 10 parallel to the underlay substrate 100 can be, but not limited to, a circle, a square, an oval, or a rhombus in the present disclosure.

The present disclosure further provides a display device including any display panel as described in the present disclosure. A front camera is installed below the transparent display region 10. A shape and a size of the transparent display region 10 match those of the front camera installed below the transparent display region 10.

Figure 5A:
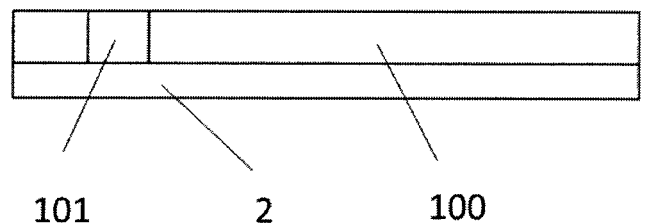

The present disclosure further provides a method for manufacturing a display panel. As shown in FIGS. 5a through 5g, which are schematic structural diagrams of a display panel in executed steps of the method for manufacturing a display panel according to a preferred embodiment of the present disclosure, the method includes:

Step S01: disposing the third hole 101 in the underlay substrate 100 corresponding to the transparent display region 10 using a laser cutting process, and filling the third hole 101 with a transparent flexible filling material (as shown in FIG. 5a).

Figure 5B:
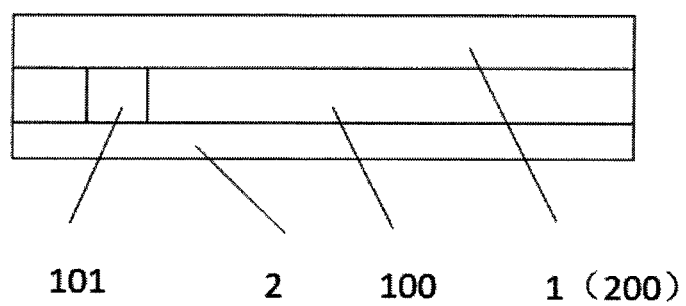

Step S02: disposing the array substrate 1 including at least two inorganic layers 200 on the underlay substrate 100 (as shown in FIG. 5b).

Figure 5C:
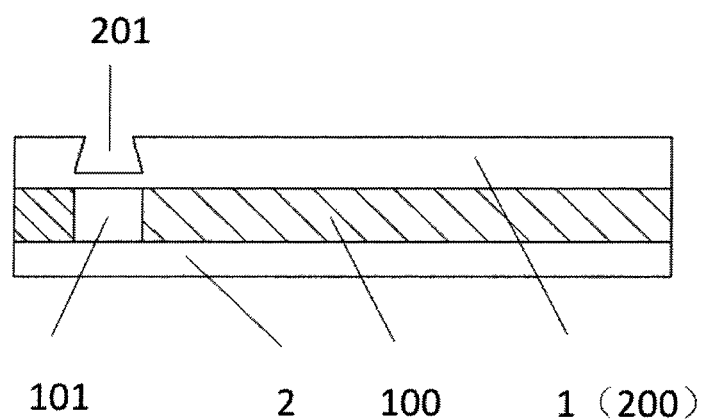

Step S03: forming the first hole 201 in at least two inorganic layers 200 corresponding to the transparent display region 10 using a dry etch process or a wet etch process (as shown in FIG. 5c).

Figure 5D:
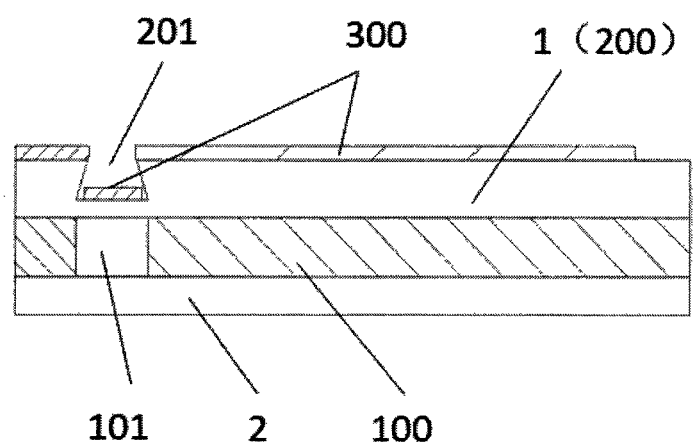

Step S04: evaporating the organic light-emitting layer 300 on a thin-film transistor layer 200. The organic light-emitting layer 300 breaks in a position of the first hole 201 (as shown in FIG. 5d).

Step S05: disposing the transparent sealant 202 around the first hole 201 so that the transparent sealant 202 covers the edges of the faults of the organic light-emitting layer 300, and cutting the organic light-emitting layer 300 corresponding to the transparent display region 10 using a laser device 3 (as shown in FIGS. 5e(1) and 5e(2)).

Figure 5F:
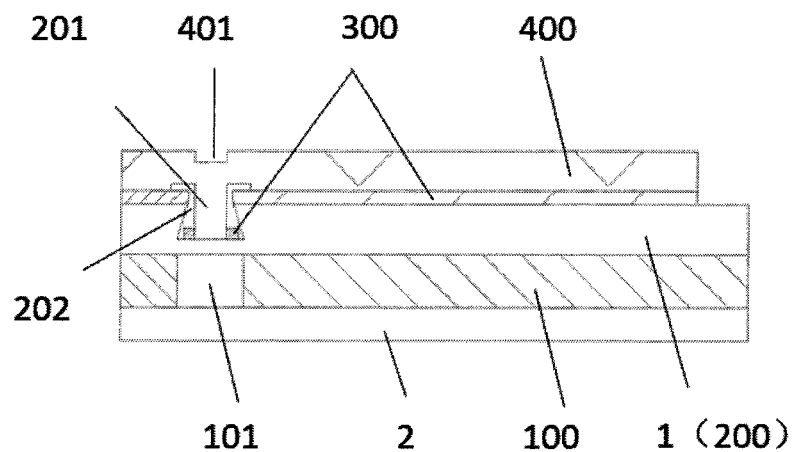

Step S06: preparing the thin-film encapsulation layer 400, and disposing the second hole 401 in the thin-film encapsulation layer to which the first hole 201 corresponds using an etching process (as shown in FIG. 5f).

Figure 5G:
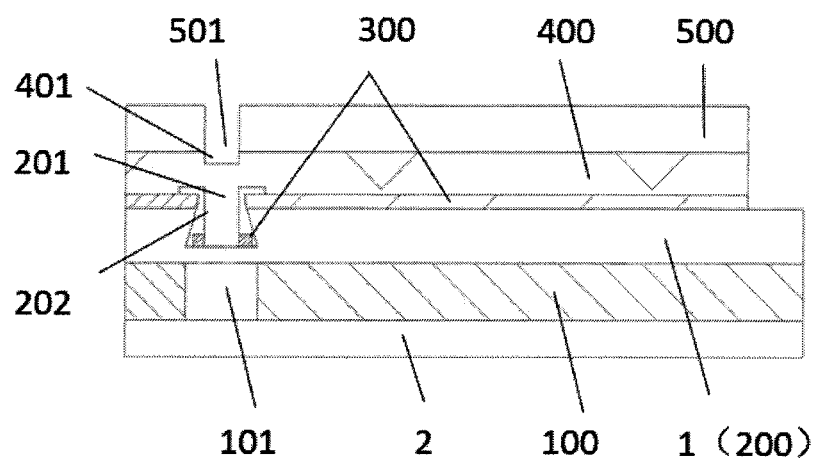

Step S07: sticking the polarizing film 500 on the thin-film encapsulation layer 400, and disposing the through hole 501 in the polarizing film 500 using an etching process so that the through hole 501 passes through the polarizing film 500 and communicates with the second hole 401 (as shown in FIG. 5g).

In conclusion, in the display panel, the display device, and the manufacturing method provided by the present disclosure, disposing the first hole 201 in the array substrate 1 including at least two inorganic layers 200 to which the transparent display region 10 corresponds. A cross-section of the first hole 201 perpendicular to the underlay substrate 100 is of a structure with a narrow upper portion and a wide lower portion. The organic light-emitting layer 300 has faults in a position of the first hole 201 corresponding to the transparent display region 10. The transparent sealant 202 is used to cover the edges of the faults of the organic light-emitting layer 300. In addition, after a part of the organic light-emitting layer 300 in the first hole 201 is eliminated by a laser, the edges of the faults of the organic light-emitting layer 300 are still covered with the transparent sealant 202, so that the transparent sealant 202 can protect the edges of the organic light-emitting layer 300, preventing vapors from invading devices through the edges of the faults of the organic light-emitting layer 300 and thus improving the reliability of the display device.

The foregoing discussions are merely some preferred embodiments of the present disclosure, it should be noted that, for an ordinary skill in the art, under the premise of without departing from the principle of the present disclosure, several improvements and modifications can be made, and these improvements and modifications should be included in the protection scope of the present disclosure.

What is claimed is:

1. A display panel having a transparent display region and an ordinary display region surrounding the transparent display region, the display panel comprising:
   an array substrate comprising at least two inorganic layers disposed on an underlay substrate;
   an organic light-emitting layer disposed on the array substrate;
   a thin-film encapsulation layer disposed on the organic light-emitting layer and covering the organic light-emitting layer, at least one first hole, and a transparent sealant; and
   a polarizing film stuck on the thin-film encapsulation layer;
   wherein in the transparent display region, the at least two inorganic layers of the array substrate comprise the at least one first hole extending from a surface of an inorganic layer in contact with the organic light-emitting layer toward the underlay substrate along a vertical direction, and an aperture size of the at least one first hole in the surface of the inorganic layer in contact with the organic light-emitting layer is less than that of the at least one first hole extending toward the underlay substrate;
   wherein the organic light-emitting layer breaks in a position of the at least one first hole;
   wherein the transparent sealant is disposed around the at least one first hole to cover edges of a fault of the organic light-emitting layer; and
   wherein textures of the at least two inorganic layers of the array substrate are gradually loose in a direction from the organic light-emitting layer to the underlay substrate.

2. The display panel of claim 1, wherein the polarizing film has a through hole corresponding to the at least one first hole.

3. The display panel of claim 2, wherein the thin-film encapsulation layer has a second hole corresponding to the at least one first hole, and wherein the second hole communicates with the through hole.

4. The display panel of claim 1, wherein a height of the transparent sealant perpendicular to the underlay substrate is greater than or equal to the sum of a depth of the at least one first hole and a thickness of the organic light-emitting layer.

5. The display panel of claim 1, wherein in the transparent display region, the underlay substrate has a third hole corresponding to the at least one first hole, a transparent flexible filling material is disposed in the third hole, and the transparent flexible filling material is colorless polyimide (CPI).

6. The display panel of claim 5, wherein the third hole passes through the underlay substrate or a part of the underlay substrate vertically.

7. The display panel of claim 1, wherein the transparent display region has a shape of a circle, a square, an oval, or a rhombus.

8. A display panel having a transparent display region and an ordinary display region surrounding the transparent display region, the display panel comprising:
   an array substrate comprising at least two inorganic layers disposed on an underlay substrate;
   an organic light-emitting layer disposed on the array substrate;
   a thin-film encapsulation layer disposed on the organic light-emitting layer; and
   a polarizing film attached on the thin-film encapsulation layer;
   wherein in the transparent display region, the at least two inorganic layers of the array substrate comprise at least one first hole extending from a surface of an inorganic layer in contact with the organic light-emitting layer toward the underlay substrate along a vertical direction, and an aperture size of the at least one first hole in the surface of the inorganic layer in contact with the organic light-emitting layer is less than that of the at least one first hole extending toward the underlay substrate; and
   wherein the organic light-emitting layer is discontinuous in a position of the at least one first hole, and the thin-film encapsulation layer covers the organic light-emitting layer, the at least one first hole, and a transparent sealant.

9. The display panel of claim 8, wherein the transparent sealant is disposed around the at least one first hole to cover edges of a fault of the organic light-emitting layer.

10. The display panel of claim 8, wherein the polarizing film has a through hole corresponding to the at least one first hole.

11. The display panel of claim 10, wherein the thin-film encapsulation layer has a second hole corresponding to the at least one first hole, and wherein the second hole communicates with the through hole.

12. The display panel of claim 8, wherein textures of the at least two inorganic layers of the array substrate are gradually loose in a direction from the organic light-emitting layer to the underlay substrate.

13. The display panel of claim 8, wherein a height of the transparent sealant perpendicular to the underlay substrate is greater than or equal to the sum of a depth of the at least one first hole and a thickness of the organic light-emitting layer.

14. The display panel of claim 8, wherein in the transparent display region, the underlay substrate has a third hole corresponding to the at least one first hole, a transparent flexible filling material is disposed in the third hole, and the transparent flexible filling material is colorless polyimide (CPI).

15. The display panel of claim 14, wherein the third hole passes through the underlay substrate or a part of the underlay substrate vertically.

* * * * *